(12) United States Patent
Kondou (10) Patent No.: US 11,806,748 B2
(45) Date of Patent: Nov. 7, 2023

(54) TACTILE GENERATION APPARATUS AND TACTILE GENERATION METHOD

(71) Applicant: Marelli Corporation, Saitama (JP)

(72) Inventor: Daisuke Kondou, Saitama (JP)

(73) Assignee: Marelli Corporation, Saitama (JP)

( * ) Notice: Subject to any disclaimer, the term of this patent is extended or adjusted under 35 U.S.C. 154(b) by 696 days.

(21) Appl. No.: 16/982,873

(22) PCT Filed: Mar. 22, 2019

(86) PCT No.: PCT/JP2019/012113
§ 371 (c)(1),
(2) Date: Sep. 21, 2020

(87) PCT Pub. No.: WO2019/208046
PCT Pub. Date: Oct. 31, 2019

(65) Prior Publication Data
US 2021/0023586 A1    Jan. 28, 2021

(30) Foreign Application Priority Data

Apr. 25, 2018  (JP) ................................. 2018-083836
Feb. 27, 2019  (JP) ................................. 2019-033414

(51) Int. Cl.
*B06B 1/04*         (2006.01)
*B60K 37/02*        (2006.01)
(Continued)

(52) U.S. Cl.
CPC .............. *B06B 1/045* (2013.01); *B60K 37/02* (2013.01); *B60R 16/023* (2013.01); *H03K 17/962* (2013.01); *B60K 2370/1446* (2019.05)

(58) Field of Classification Search
CPC .............................. B06B 1/045; B60K 37/02; B60K 2370/1446; B60R 16/023; H03K 17/962;
(Continued)

(56) References Cited

U.S. PATENT DOCUMENTS 6,404,085 B2 *  6/2002  Hamaguchi ............. B06B 1/045
                                                      381/396
11,707,869 B2 *  7/2023  Inoue ................... B29C 44/1257
                                                      428/297.1
(Continued)

FOREIGN PATENT DOCUMENTS

CN          103811212 A       5/2014
CN          104205589 A       12/2014
(Continued)

*Primary Examiner* — Adolf D Berhane
(74) *Attorney, Agent, or Firm* — Young Basile Hanlon & MacFarlane, P.C.

(57) ABSTRACT

To prevent generation of a loud impact sound, a tactile generation apparatus is provided with a vibration generator on a back surface of a vibration member. The vibration generator is a solenoid including a movable core and a coil. The movable core is capable of moving close to and away from the vibration member. The coil displaces the movable core toward the vibration member to deform the vibration member when energized, and moves the movable core away from the vibration member when deenergized, so as to vibrate the vibration member due to an elastic restoring force of the vibration member.

12 Claims, 7 Drawing Sheets

(51) Int. Cl.
*B60R 16/023* (2006.01)
*H03K 17/96* (2006.01)

(58) Field of Classification Search
CPC ........ H02K 33/00; H02K 33/02; H02P 25/32; G06F 3/016
See application file for complete search history.

(56) References Cited

U.S. PATENT DOCUMENTS

| | | |
|---|---|---|
| 2014/0132375 A1 | 5/2014 | Sawaguchi |
| 2015/0123500 A1 | 5/2015 | Jung |
| 2016/0274665 A1 | 9/2016 | Wakuda et al. |

FOREIGN PATENT DOCUMENTS

| | | |
|---|---|---|
| CN | 105988587 A | 10/2016 |
| JP | H10-296187 A | 11/1998 |
| JP | 2001-300452 A | 10/2001 |
| JP | 2004-50154 A | 2/2004 |
| JP | 2015-215830 A | 12/2015 |
| WO | 2016153261 A1 | 9/2016 |

\* cited by examiner

TACTILE GENERATION APPARATUS AND TACTILE GENERATION METHOD

CROSS-REFERENCE TO RELATED APPLICATION

The present application is based on and claims priority to Japanese Patent Application No. 2018-083836, filed on Apr. 25, 2018, the disclosure of which is hereby incorporated by reference in its entirety. Additionally, the present application is based on and claims priority to Japanese Patent Application No. 2019-033414, filed on Feb. 27, 2019, the disclosure of which is hereby incorporated by reference in its entirety.

TECHNICAL FIELD

This disclosure relates to a tactile generation apparatus and a tactile generation method.

BACKGROUND

A device such as an electronic device including an input part equipped with a tactile generation apparatus has been known. Such a tactile generation apparatus is provided with a vibration generator on the back surface of a vibration member. When a user touches the surface of the vibration member, the device generates vibration (haptic vibration) on the vibration member by means of the vibration generator provided on the back surface of the vibration member. With this, the user can feel the vibration as tactile sensation. Accordingly, it is possible to give an actual feeling (operation feeling) in response to manipulation of the input part by providing the tactile generation apparatus at the input part such as a switch (see JP2015-215830 A).

SUMMARY

Since the conventional tactile generation apparatus generates vibration by directly hitting the vibration member with the vibration generator, it generates a loud impact sound, disadvantageously.

In order to solve the above problem, a tactile generation apparatus of this disclosure includes a vibration member and a vibration generator that is installed on a back surface of the vibration member. The vibration generator is configured with a solenoid including a movable core and a coil, the movable core being capable of moving close to and away from the vibration member. The coil is configured to displace the movable core to the vibration member so as to press and deform the vibration member when energized, while the coil is configured to move the movable core away from the vibration member when deenergized, so as to vibrate the vibration member due to an elastic restoring force of the vibration member.

With this disclosure, it is possible to prevent generation of a loud impact sound.

DETAILED DESCRIPTION

Hereinafter, an embodiment of the present disclosure will be described with reference to the drawings.

FIG. 1 to FIG. 8B are to explain the embodiment of the present disclosure.

First Embodiment

Configuration

Hereinafter, a configuration of the embodiment will be described.

Figure 1:
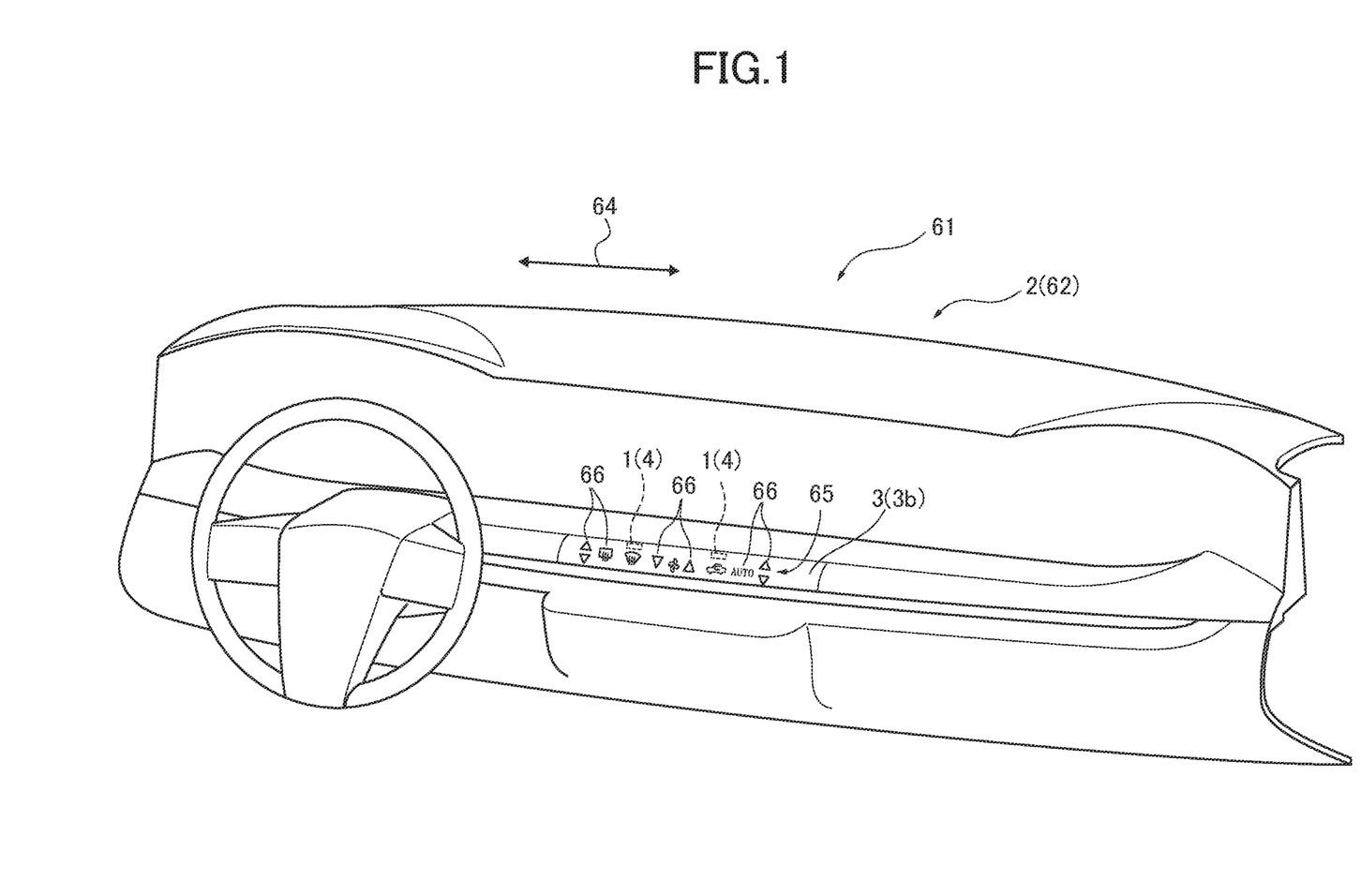
FIG. 1 is an overall perspective view of an interior part of a vehicle to which a tactile generation apparatus according to an embodiment is applied.
Figure 2A:
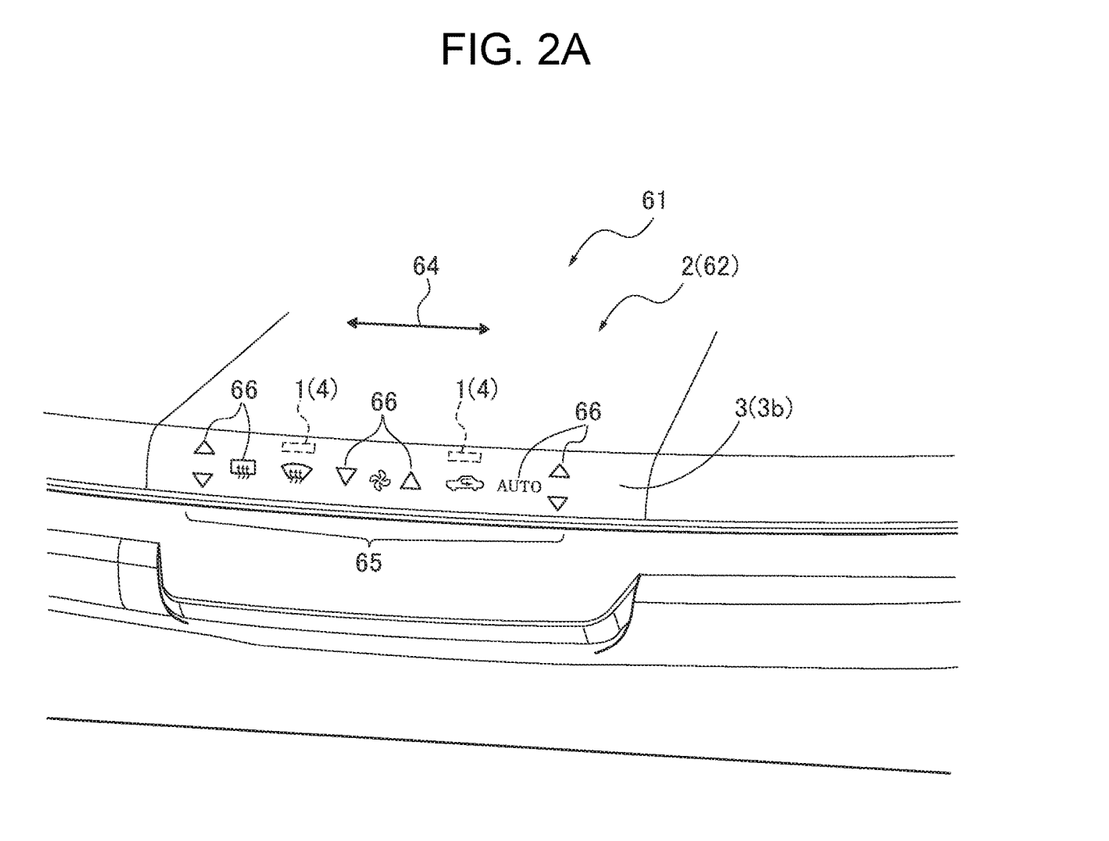
FIG. 2A is a partial enlarged view of FIG. 1.

A tactile generation apparatus 1 of this embodiment is applied to, for example, an interior part 2 of a vehicle, as shown in FIG. 1 and FIG. 2A.

Figure 3:
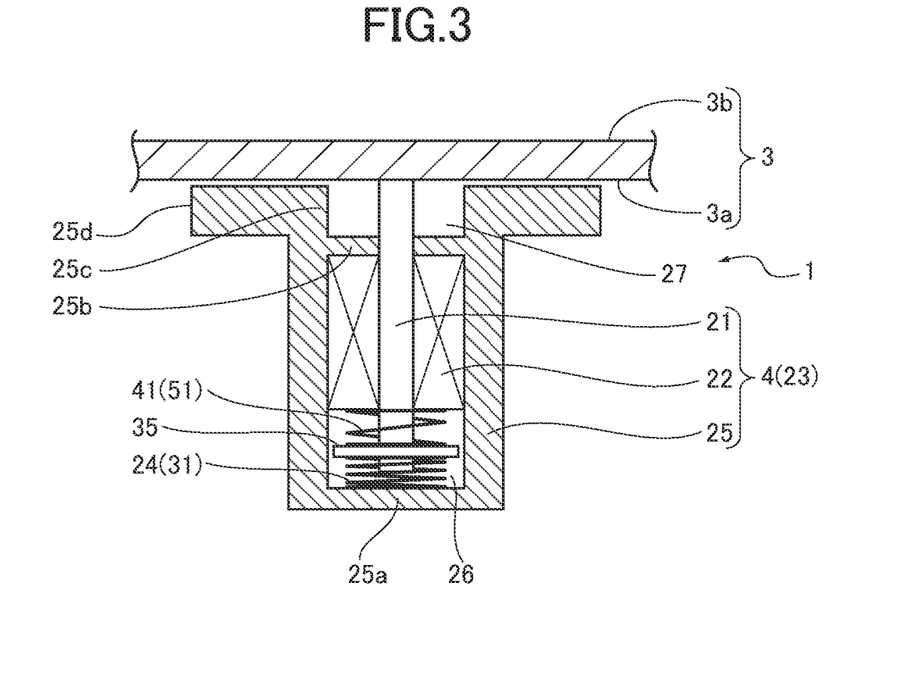
FIG. 3 is a longitudinal cross-sectional view of the tactile generation apparatus (Non-Energized; Standby State)
Figure 4:
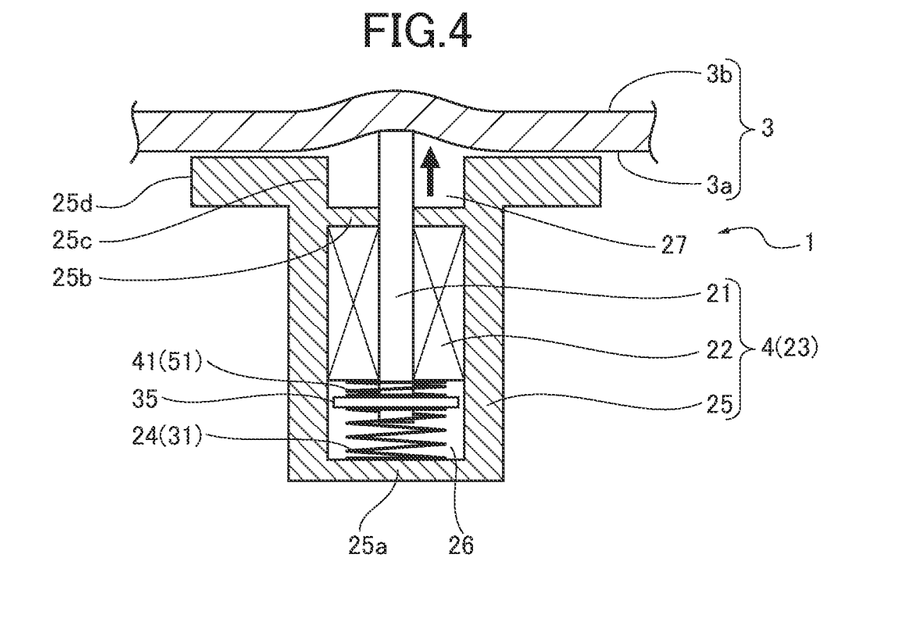
FIG. 4 is a longitudinal cross-sectional view of the tactile generation apparatus (Energized; Operating State)

As shown in FIG. 3 (to FIG. 5), the tactile generation apparatus 1 includes a vibration generator 4 on a back surface 3a of a vibration member 3.

The tactile generation apparatus 1 means an apparatus configured to artificially generate tactile feeling or tactile sensation. The tactile generation apparatus 1 is configured to provide vibration (haptic vibration) to a finger as tactile sensation when the finger touches a front surface 3b of the vibration member 3.

The vibration member 3 is provided to generate tactile sensation by means of vibration. The vibration member 3 is preferably a member which has a predetermined flat shape as the contact surface (front surface 3b). The vibration member 3 may be an independent article or may be attached to a surface of an article to form a part of the article. The back surface 3a of the vibration member 3 is preferably hidden such that the vibration generator 4 is not visible directly from the outside.

The vibration member 3 is preferably composed of a member that easily vibrates, and the vibration member 3 is preferably positioned so as to easily vibrate. The vibration generator 4 is preferably positioned in accordance with the position where the vibration member 3 easily vibrates. For example, a fixed point of the vibration member 3 that is fixed with respect to an article or an external member and the peripheral portion of the vibration member 3 close to the fixed point are difficult to vibrate. On the other hand, a portion away from the fixed point easily vibrates. Therefore, the vibration generator 4 is preferably positioned away from the fixed point of the vibration member 3 such that it is easy for the vibration generator 4 to vibrate the vibration member 3. For example, the vibration generator 4 may be positioned at an intermediate portion between fixed points.

The vibration generator 4 is an actuator configured to generate vibration on the vibration member 3. The vibration generator 4 is provided solely or plurally at portion(s) of the vibration member 3 where vibration is desired. The vibration member 3 may generate vibration at a single point or a plurality of points. The vibration generator 4 may be fixed on the back surface 3a of the vibration member 3 directly. Alternatively, the vibration generator 4 may be fixed to an article or an external member to which the vibration member 3 attached, so that the vibration generator 4 faces the back surface 3a of the vibration member 3.

If the vibration generator 4 is directly fixed to the back surface 3a of the vibration member 3, the portion of the vibration member 3 to which the vibration generator 4 is fixed acts as a fixed point and hardly vibrates. Thus, the vibration range becomes narrow and limited, and the vibration amplitude also decreases. If the vibration generator 4 is not directly fixed to the back surface 3a of the vibration member 3 but fixed to the article or the external member to which the vibration member 3 is attached, the vibration around the vibration generator 4 is not disturbed. Thus, the vibration range becomes wider, and the vibration amplitude also increases. Accordingly, it is possible to optimally set and adjust the vibration range and the vibration manner of the vibration member 3 by determining how to install the vibration generator 4 depending on the purpose of the tactile generation apparatus 1. In this embodiment, the vibration generator 4 is fixed to the article or the external member to which the vibration member 3 is attached in order to obtain a large vibration in a large area.

The tactile generation apparatus 1 further includes the following configuration. (1) The vibration generator 4 is a solenoid 23 including a coil 22 and a movable core 21 which is capable of moving close to and away from the vibration member 3. The coil 22 displaces the movable core 21 toward the vibration member 3 to press and deform the vibration member 3 when energized and moves the movable core 21 away from the vibration member 3 when deenergized, so as to vibrate the vibration member 3 due to the elastic restoring force of the vibration member 3. Here, the movable core 21 may abut onto the back surface 3a of the vibration member 3 by an abutting mechanism 24 when the coil 22 is deenergized.

It should be noted that the vibration member 3 needs not elastically deform as long as it is able to generate vibration by means of the solenoid 23 (e.g., tensioned cloth or rope). However, it is preferable to form the vibration member 3 with an elastically deformable member to facilitate to generate vibration and to reduce the load of the solenoid 23. The deformation amount of the vibration member 3 caused by the solenoid 23 may be small as long as the user can feel the vibration by touching with a finger. The vibration member 3 may vibrate at least at the portion where the solenoid 23 is installed.

The vibration member 3 preferably has a shape retaining property to keep or retain the shape. The vibration member 3 is preferably elastically deformed by the pressing force of the solenoid 23 and preferably has such flexibility and toughness capable that the shape thereof can be restored when the pressing force is released. The vibration member 3 is preferably made of a material that is relatively hard and relatively thin. For example, the vibration member 3 is preferably formed as a thin plate member or a panel member made of hard resin, metal, or wood.

"Moving close to and away from" means a movement in which the movable core 21 approaches the vibration member 3 and moves away from the vibration member 3.

The solenoid 23 is an electromagnetic actuator that includes the bar-shaped movable core 21 and the coil 22 wound around the movable core 21 so as to accommodate the movable core 21 inside thereof. With the solenoid 23, an electromagnetic force is generated by energizing the coil 22 such that the movable core 21 moves toward one side (i.e., vibration member 3) in the axial direction (or in longitudinal direction) with respect to the coil 22 (this movement may be referred to as "protruding motion"). Accordingly, the vibration member 3 is pressed and deformed. The electromagnetic force disappears by deenergizing the coil 22 such that the movable core 21 returns to the other side (i.e., opposite direction to vibration member 3) (this movement may be referred to as "returning motion"). Accordingly, the vibration member 3 is restored due to the self-elastic restoring force. Here, it is also possible to use the weight of the movable core 21 for the movement of the vibration member 3. The movable core 21 is extended in the axial direction beyond both edges of the coil 22. When the coil 22 is energized, the movable core 21 in the one side (i.e., protruding side) is greatly protruded from the coil 22 more than the other side (i.e., returning side).

The solenoid 23 is configured to accommodate the coil 22 inside a cylindrical case 25, and the coil 22 is positioned coaxially with the case 25. The movable core 21 can be protruded to the outside from at least one side of the case 25. The solenoid 23 is installed such that the movable core 21 is oriented in a direction across the vibration member 3, particularly in a direction perpendicular to the vibration member 3 and the one side of the case 25 is oriented to the back surface 3a of the vibration member 3. The solenoid 23 may adjust the protruding amount of the movable core 21 in accordance with the power supplied to the coil 22.

The case 25 has a bottom on the side opposite to the vibration member 3 (i.e., other side of case 25). A first space 26 is formed between the other end of the coil 22 and the bottom 25a of the case 25. The first space 26 is longer in the axial direction than the moving range of the end portion (other end portion) of the movable core 21 on the other side, and the other end portion of the movable core 21 moves in the axial direction while accommodated inside the first space 26.

The case 25 is partitioned by a partition 25b on the side close to the vibration member 3 (i.e., one side of case 25), The partition 25b is provided parallel to the bottom 25a. The coil 22 is accommodated in a space between the partition 25b and the bottom 25a of the case 25, and one end of the coil 22 is fixed to the other surface of the partition 25b. The other end of the coil 22 defines the first space 26.

The portion of the case 25 closer to the vibration member 3 than the partition 25b forms an extension portion 25c which is extended to a position on the back surface 3a of the vibration member 3. The edge of the extension portion 25c is provided with a flange portion 25d. The flange portion 25d may abut onto the back surface 3a of the vibration member 3 or be separated therefrom with a gap.

In order to abut the flange portion 25d onto the back surface 3a of the vibration member 3, the flange portion 25d may or may not be fixed to the back surface 3a of the vibration member 3. When the flange portion 25d is not fixed to the back surface 3a of the vibration member 3 or when the flange portion 25d is provided separately from the back surface 3a of the vibration member 3, the case 25 is attached to a member other than the vibration member 3. Here, a cushion member may be provided on the surface of the flange portion 25d that faces the vibration member 3 to absorb the impact on the vibration member 3.

A second space 27 is formed inside the extension portion 25c (or flange portion 25d), i.e., between the partition 25b and the back surface 3a of the vibration member 3. The axial dimension of the second space 27 is determined such that the end portion (tip portion) of the movable core 21 on the one side protrudes outside of the flange portion 25d when it is fully protruded, while the end portion of the movable core 21 on the one side is accommodated inside the flange portion 25d when it is fully retracted.

To further describe the movable core 21 of the tactile generation apparatus 1, the end portion (tip portion) of the movable core 21 on the one side is separated from the back surface 3a of the vibration member 3 and is not fixed to or engaged with the back surface 3a of the vibration member 3.

Figure 6:
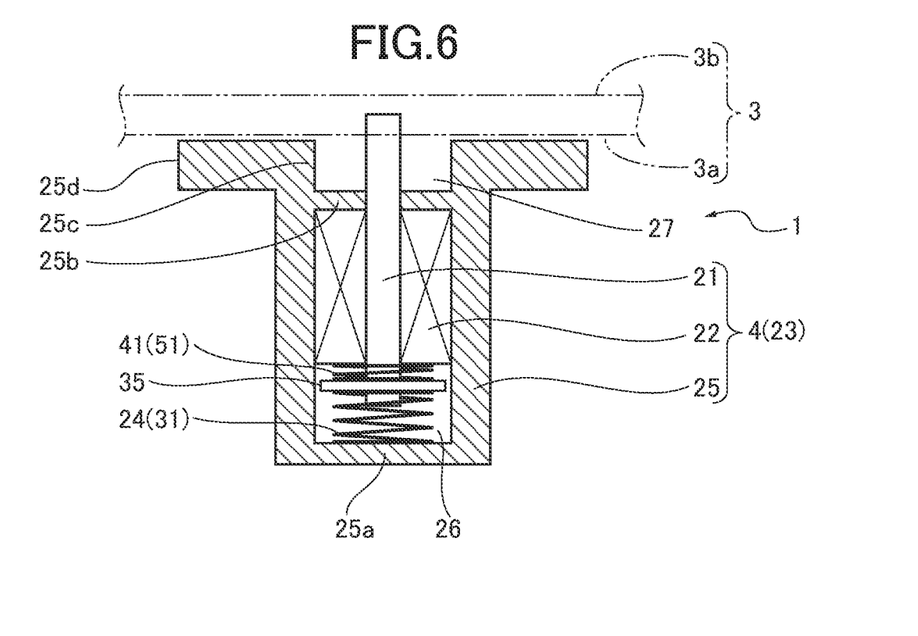
FIG. 6 is a longitudinal cross-sectional view of the tactile generation apparatus without a vibration member.

Without the abutting mechanism 24, the tip portion of the movable core 21 is retracted (in deenergized state) and positioned away from the back surface 3a of the vibration member 3. With the abutting mechanism 24, the tip portion of the movable core 21 is pressed by the abutting mechanism 24 so as to protrude outward from the one end of the case 25 to the maximum protruding position, as illustrated in FIG. 6. As illustrated in FIG. 3, the tip portion of the movable core 21 is suppressed by the back surface 3a of the vibration member 3 so as to be retracted to an intermediate position between the maximum protruding position and the maximum retracting position and to wait in a state of abutting the back surface 3a (standby state).

When the coil 22 is energized, the tip portion of the movable core 21 is forced to protrude beyond the position of the back surface 3a of the vibration member 3 in the normal state to the maximum protruding position, as illustrated in FIG. 4. With the protrusion of the movable core 21 due to the energization, the vibration member 3 is pressed and deformed into a shape protruding toward the front surface with respect to the shape in the standby state. Here, the position of the tip portion of the movable core 21 is identical to that illustrated in FIG. 6.

It should be noted that any means may be used as the abutting mechanism 24 as long as it is possible to abut the movable core 21 onto the back surface 3a of the vibration member 3 in the standby state. Preferably, the abutting mechanism 24 is configured as described later.

(2) The abutting mechanism 24 may be an elastic abutting member 31 that presses the movable core 21 to the back surface 3a of the vibration member 3.

As the abutting mechanism 24 (or abutting part), another actuator (driving part) similar to that of the solenoid 23 may be used. It is, however, preferable to use the elastic abutting member 31 to simplify the structure of the vibration generator 4.

The elastic abutting member 31 is a member (elastic member) that abuts the movable core 21 onto the back surface 3a of the vibration member 3 by means of the elastic force. The elastic abutting member 31 may be installed such that the pressing force is substantially released when the movable core 21 abuts the back surface 3a of the vibration member 3. Alternatively, the elastic abutting member 31 may be installed such that the movable core 21 is pressed to the back surface 3a of the vibration member 3 with the elastic force that allows the vibration member 3 to keep its shape. "The elastic force that allows the vibration member 3 to keep its shape" means the deformation of the vibration member 3 is suppressed to the extent that it cannot be seen from outside when the movable core 21 abuts onto the vibration member 3 due to the elastic force of the elastic abutting member 31 in the standby state.

As described above, when the vibration generator 4 is not covered by the vibration member 3, the movable core 21 is pressed by the elastic abutting member 31 and is protruded to the position of the back surface 3a of the vibration member 3 in the non-deformed state as indicated by the dash-double-dotted line or to the maximum protruding position beyond the position of the back surface 3a of the vibration member 3 in the non-deformed state (see FIG. 6). When the vibration member 3 is placed on the vibration generator 4 under such a condition, the movable core 21 is suppressed by the vibration member 3 and is positioned at an intermediate position in the movable range while abutting onto the back surface 3a of the vibration member 3 (standby state), as illustrated in FIG. 3. As the elastic force of the elastic abutting member 31 is determined as described above, the vibration member 3 does not deform due to the elastic force of the elastic abutting member 31 applied to the vibration member 3 through the movable core 21. The shape of the vibration member 3 is thus maintained in substantially the same shape as before the elastic force is applied. As a result, the shape of the vibration member 3 is not adversely affected.

As the elastic abutting member 31, a spring or an elastic body may be used. The spring may be a compression spring such as a coil spring. The elastic body may be an elastic material such as rubber. In these cases, it is preferable to form the elastic abutting member 31 with an elastic member having an elastic force less than the shape retention force of the vibration member 3 (i.e., elastic force of elastic abutting member 31<shape retention force of vibration member 3). Additionally, the elastic abutting member 31 is configured so as not to disturb the elastic return of the vibration member 3.

Alternatively, the shape of the vibration member 3 deformed by the elastic force of the elastic abutting member 31 in the standby state may be defined as the initial shape of the vibration member 3. In such a case, it is possible to use an elastic member having a greater elastic force than the shape retention force of the vibration member 3 as the elastic abutting member 31.

The elastic abutting member 31 may be installed on the retracting side of the solenoid 23 (i.e., in first space 26) or on the protruding side of the solenoid 23 (i.e., in second space 27).

If the elastic abutting member 31 is installed on the retracting side of the solenoid 23, the elastic abutting member 31 is interposed between the bottom of the case 25 and a first flange portion 35, which is provided at the end or in the vicinity of the end of the movable core 21 in the retracting side, as illustrated in FIG. 3.

Figure 7:
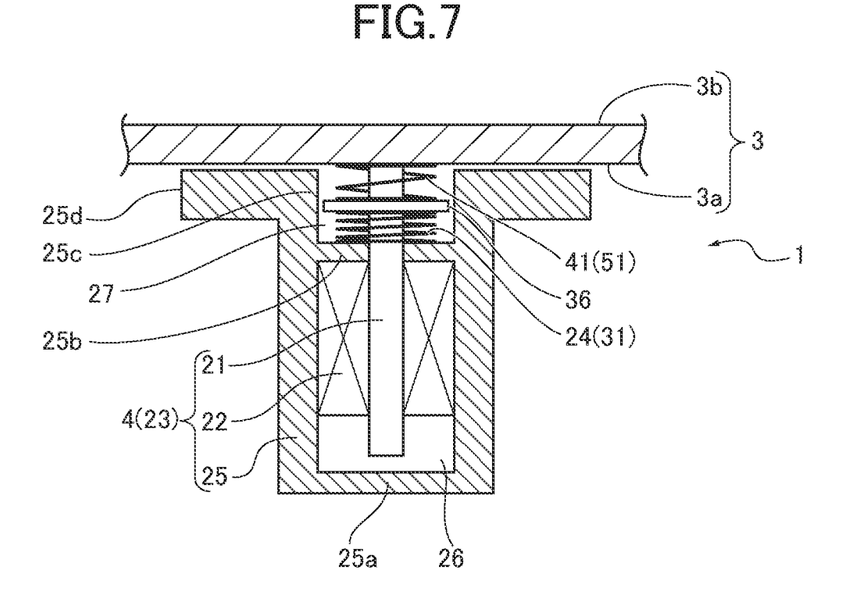
FIG. 7 is a longitudinal cross-sectional view of another example of the tactile generation apparatus.

If the elastic abutting member 31 is installed on the protruding side of the solenoid 23, the elastic abutting member 31 is interposed between the partition 25b and a second flange portion 36, which is integrally provided at the end or in the vicinity of the end of the movable core 21 in the protruding side, as illustrated as a variant in FIG. 7.

If the elastic abutting member 31 is formed of a spring (coil spring), the spring may be fit outside of the movable core 21. If the elastic abutting member 31 is formed of an elastic material such as rubber, the elastic material may be formed into a ring shape so as to be fit outside the movable core 21.

(3) A return assistance mechanism 41 may be provided in order to accelerate the retracting movement of the movable core 21 with respect to the vibration member 3 when the coil 22 is deenergized.

Figure 5:
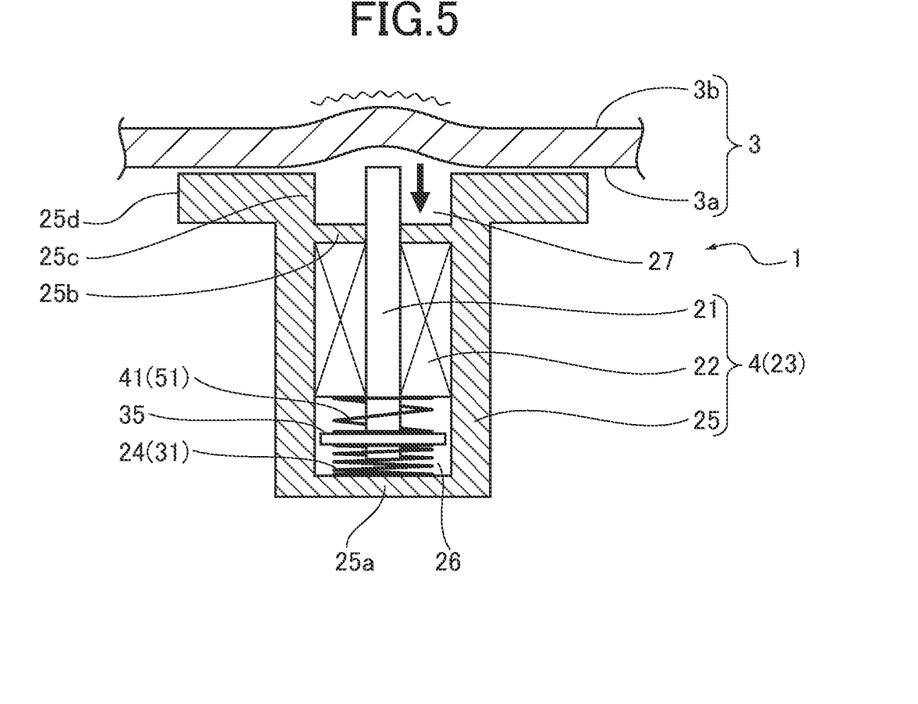
FIG. 5 is a longitudinal cross-sectional view of the tactile generation apparatus (Non-Energized; Operating State)

It should be noted that "when the coil 22 is deenergized" means the electromagnetic force applied to the movable core 21 to generate vibration on the vibration member 3 is removed. The retracting movement includes a case where the movable core 21 is not separated from the vibration member 3 and a case where the movable core 21 is separated from the vibration member 3, as illustrated in FIG. 5. If the movable core 21 is not separated from the vibration member 3, vibration may be generated due to, for example, deformation or displacement of the vibration member 3 which follows the movement of the movable core 21. If the movable core 21 is separated from the vibration member 3, vibration may be generated due to, for example, deformation or displacement of the vibration member 3 without following the movement of the movable core 21.

It should be noted that any means may be used as the return assistance mechanism 41 (or return assister) as long as it is possible to increase the speed of the retracting movement of the movable core 21 with respect to the vibration member 3. Preferably, the return assistance mechanism 41 is configured as described later.

(4) The return assistance mechanism 41 may be an elastic retracting member 51 that is configured to press the movable core 21 in the direction away from the vibration member 3.

As the return assistance mechanism 41, another actuator (driving part) similar to that of the solenoid 23 may be used. It is, however, preferable to use the elastic retracting member 51 as the return assistance mechanism 41 to simplify the structure of the vibration generator 4.

The elastic retracting member 51 is provided without disturbing the elastic return of the vibration member 3. Under the operating state, the elastic retracting member 51 is deformed by the solenoid 23 and accumulates an elastic force while the movable core 21 is protruded by energizing the coil 22. The elastic retracting member 51 may be made of an elastic member having an elastic force weaker than the elastic force of the elastic abutting member 31 (i.e., elastic force of elastic retracting member 51<elastic force of elastic abutting member 31), such that the elastic retracting member 51 is deformed by the elastic force of the elastic abutting member 31 in the standby state. Alternatively, the elastic retracting member 51 may be installed such that the pressing force of the elastic retracting member 51 as well as that of the elastic abutting member 31 are substantially released.

As the elastic retracting member 51, a retracting spring or a retracting elastic body may be used. The retracting spring may be a coil spring or a compression spring. The retracting elastic body may be rubber or an elastic body.

The elastic retracting member 51 may be installed on the retracting side of the solenoid 23 (i.e., in first space 26) or on the protruding side of the solenoid 23 (i.e., in second space 27).

If the elastic retracting member 51 is installed on the retracting side of the solenoid 23, the elastic retracting member 51 is interposed between the other end of the coil 22 and the first flange portion 35, which is provided in the middle of the end of the movable core 21 in the retracting side, as illustrated in FIG. 3.

If the elastic retracting member 51 is installed on the protruding side of the solenoid 23, the elastic retracting member 51 is interposed between the back surface 3a of the vibration member 3 and the second flange portion 36, which is integrally provided at the end or in the vicinity of the end of the movable core 21 in the protruding side, as illustrated as a variant in FIG. 7.

If the elastic retracting member 51 is formed of a retracting spring (coil spring), the retracting spring may be fit outside of the movable core 21. If the elastic retracting member 51 is formed of an elastic material such as rubber, the elastic material may be formed into a ring shape so as to be fit outside the movable core 21.

(5) As illustrated in FIG. 1 and FIG. 2A, the vibration member 3 may be provided at the interior part 2 installed on a vehicle 61.

The vibration member 3 may also be provided at an interior part 2 installed in a room of a building, but also be provided at the interior part 2 installed on the vehicle 61. The interior part 2 means a device, an article, or a decorative item provided in a room or a vehicle cabin. The vibration member 3 may be installed on a component that constitutes the surface design of the interior part 2. Alternatively, as long as it is possible to feel the tactile sensation, the vibration member 3 may be installed inside the interior part 2 so as not to be seem from the outside.

An example of the interior part 2 installed inside (the cabin of) the vehicle 61 is, an interior panel 62 (vehicle interior panel) such as an instrument panel and a center console. Additionally, a supplemental interior part 2 such as a subpanel or a finisher may be attached to the interior part 2. The interior part 2 such as the instrument panel, center console, subpanel, and finisher has a complicated three-dimensional shape in terms of the design.

With this embodiment, the interior part 2, such as the instrument panel and the center console, or the supplemental interior part 2 attached to the interior part 2 is used as the vibration member 3.

(6) The vibration generator 4 may be provided around a touch switch 65, which is installed on the interior part 2.

It is commonly known that there are vehicles 61 which are provided with a switch panel at the instrument panel or the center console forming the interior part 2. In general, the switch panel is provided separately from the interior part 2, such as the instrument panel and the center console, or from the supplemental interior part 2, such as the subpanel and the finisher, and includes a switch button (real button) pressed by a finger on the surface of the switch panel.

In this embodiment, on the other hand, a switch made of a touch sensor (touch switch 65) is provided on the back surface 3a of the interior part 2 such as the instrument panel and the finisher installed on the instrument panel. With this, the instrument panel or the finisher itself constitutes the switch panel. The touch sensor is a sensor that detects contact or proximity to the front surface 3b of the vibration member 3 and functions as a switch. As exemplarily illustrated in FIG. 2B, the touch switches 65 can integrally be arranged on a single sheet member 67. The sheet member 67 may be formed of an insulating resin. The touch switches 65 may be, for example, self-capacitance touch sensors that can be configured with one electrode. Additionally, an electrostatic capacitance type pressure sensor 68 capable of storing a capacitance between two electrodes (oscillation side electrode 68a and reception side electrode 68b) or an IC 69 for detecting a change in capacitance of the touch switches 65 and/or of the electrostatic capacitance type pressure sensors 68 may be provided at an edge of the single sheet member 67.

Figure 2B:
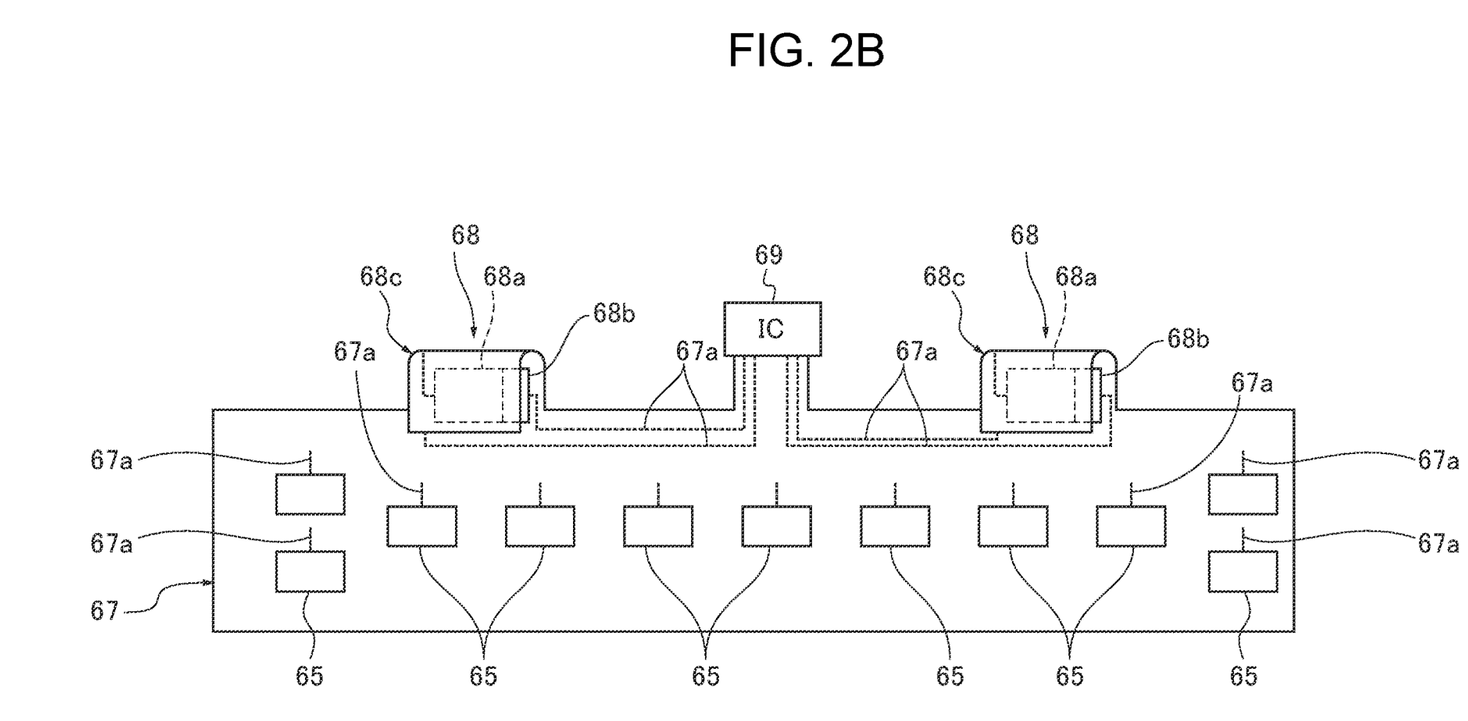
FIG. 2B is an overall configuration diagram of a sensor sheet with a pressure sensor and a plurality of touch switches.

The electrostatic capacitance type pressure sensor 68 is formed by folding a projection piece 68c of the sheet member 67 attached with the oscillation side electrode 68a and the reception side electrode 68b so as to face the oscillation side electrode 68a and the reception side electrode 68b with an interval. It should be noted that a spacer may be provided between the oscillation side electrode 68a and the reception side electrode 68b to keep the distance therebetween. The spacer may be an elastic body such as rubber capable of storing capacitance The electrostatic capacitance type pressure sensor 68 has higher sensitivity than the touch switch 65. The electrostatic capacitance type pressure sensor 68 may be provided in a one-to-many relationship with respect to the plurality of touch switches 65. In such a case, the electrostatic capacitance type pressure sensor 68 detects its displacement in the pressing direction in response to a change of the gap between the oscillation side electrode 68a and the reception side electrode 68b. The plurality of touch switches 65 allow to detect a touch position. By detecting both the displacement in the pressing direction and the touch position to determine the pressing manipulation, it is possible to prevent erroneous detection.

The sheet member 67 as configured above is disposed on the back surface of the interior part 2 such as the instrument panel. The single sheet member 67 is provided with a wire 67a to electrically connect the electrostatic capacitance type pressure sensor 68, the touch switches 65, and the IC 69. Accordingly, it is possible to eliminate a switch panel separately provided from the instrument panel and switch buttons which are physically pressed by a finger. In this embodiment, a plurality of touch switches 65 are provided near the center of the instrument panel in the vehicle width direction 64 as manipulation switches for an air conditioner. However, the arrangement of the touch switches 65 is not limited thereto.

By providing the tactile generation apparatus 1 together with the touch switches 65 on the interior part 2 (e.g., instrument panel or finisher) in the vehicle 61 and by activating the tactile generation apparatus 1 in response to the touch switches 65, the switch panel capable of generating tactile sensation in response to the input to the touch switches 65 is achieved.

Figure 8A:
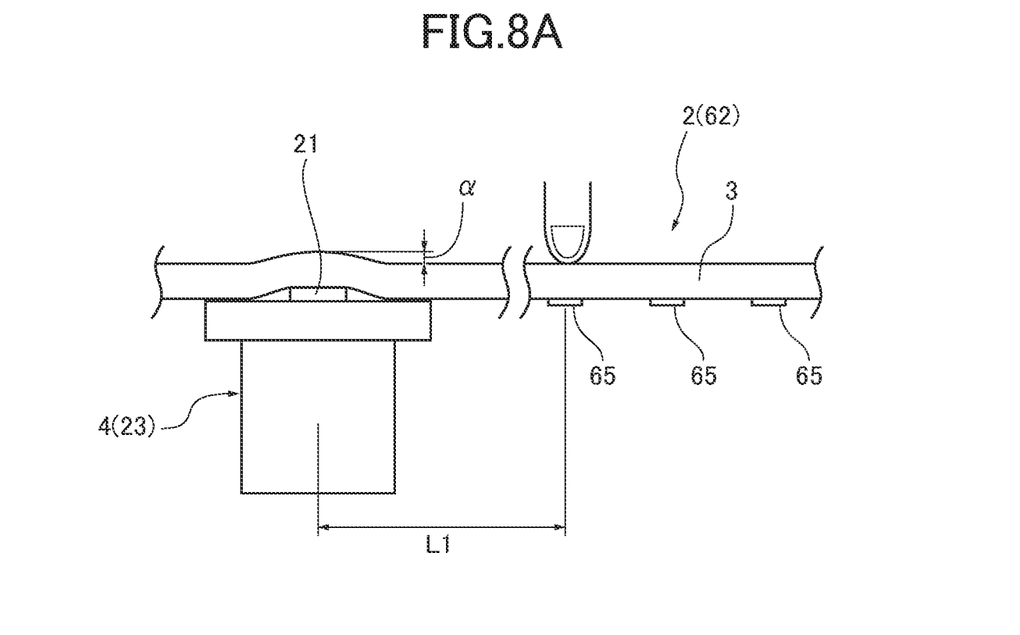
FIG. 8A shows a configuration in which a distance between a vibration generator and a touch switch is short.
Figure 8B:
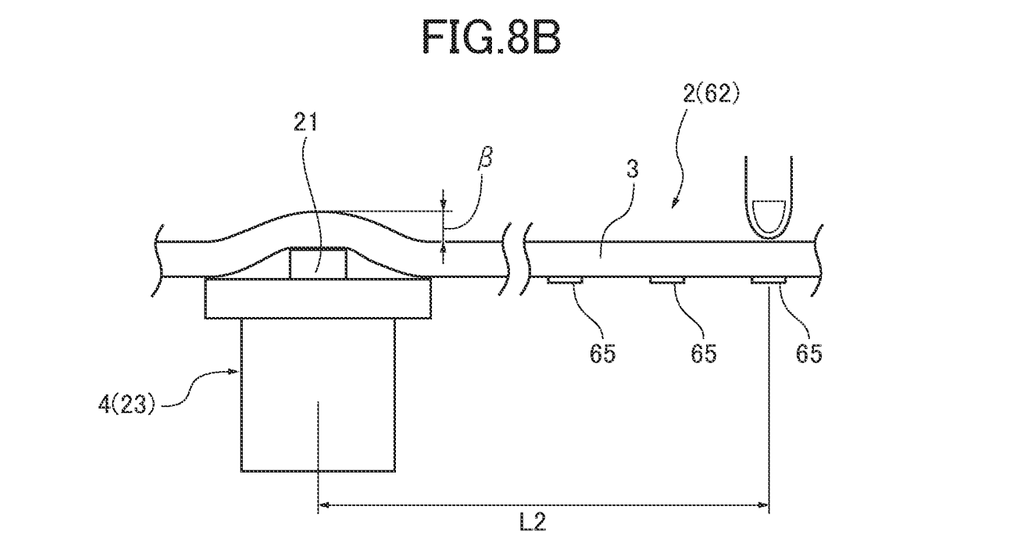
FIG. 8B shows a configuration in which the distance between the vibration generator and the touch switch is long.

The instrument panel or the finisher may be provided with a plurality of touch switches 65. The tactile generation apparatus 1 may be provided in a one-to-one relationship for each touch switch 65 or may be provided in a one-to-many relationship with respect to the plurality of touch switches 65. The tactile generation apparatus 1 is provided at an appropriate position in an area where the vibration can be felt when any of the touch switches 65 on the vibration member 3 is touched. As illustrated in FIG. 8A and FIG. 8B, the vibration generator 4 of the tactile generation apparatus 1 may change press deformation amounts α, β depending on the touch switches 65 (α<β). By changing the press deformation amounts α, β, the vibration amounts of the vibration member 3 vary. When the press deformation amount α is small, the vibration amount of the vibration member 3 is small. When the press deformation amount β is large, the vibration amount of the vibration member 3 is large. The press deformation amounts α, β of the vibration generator 4 of the tactile generation apparatus 1 with respect to the vibration member 3 may be changed in accordance with distances L1, L2 from the touch switches 65. Particularly, the press deformation amounts α, β of the vibration generator 4 of the tactile generation apparatus 1 with respect to the vibration member 3 may be reduced as the distances L1, L2 (L1<L2) from the touch switches 65 decrease (i.e., the press deformation amount α is set for the distance L1, and the press deformation amount β is set for the distance L2). The press deformation amounts with respect to the vibration member 3 are adjusted by the protruding amounts of the movable core 21.

The part of the instrument panel or of the finisher provided with the touch switches 65 constitutes a display 66. The display 66 is designed to facilitate understanding of the manipulation of the touch switches 65. The display 66 may partially include a thin portion, which allows light to pass through, in the finisher having a thickness that does not allow light to pass through. The transparent resin part of the display 66 may be embedded by two-color molding. The display 66 can be transmitted and illuminated by forming the touch switches by means of transparent electrodes and by arranging a light source on the side of the back surface 3a of the display 66 directly or through a light guiding part.

It should be noted that the interior part 2 of the vehicle 61 on which the tactile generation apparatus 1 is installed is not limited thereto. For example, the interior part 2 may be a steering wheel or a seat. If the tactile generation apparatus 1 is provided at the seat, the vibration member 3 may be, for example, a seat frame. The seat frame is covered with a cushion material and a cover so as to be invisible from the outside. The vibration generated by the tactile generation apparatus 1 should be set strong enough to be transmitted to the surface of the seat through the cushion material and the cover.

(7) Hereinafter, a tactile generation method using the tactile generation apparatus 1 will be described. The tactile generation method generates vibration on a vibration member 3 by means of a vibration generator 4 installed on a back surface 3a of the vibration member 3 in order for the user to feel tactile sensation. The vibration generator 4 is a solenoid 23 including a movable core 21, which is capable of moving close to and away from the vibration member 3, and a coil 22, which presses the movable core 21 to the vibration member 3 when energized. As illustrated in FIG. 4, the movable core 21 is pressed to the vibration member 3 to press and deform the vibration member 3 when energized. As illustrated in FIG. 5, the movable core 21 moves away from the vibration member 3 to allow the vibration member 3 to return its original shape when deenergized. Accordingly, the vibration generator 4 generates vibration on the vibration member 3 due to its own elastic restoring force.

In a state where the vibration generator 4 is deenergized prior to generating vibration, an abutting mechanism 24 (e.g., elastic abutting member 31) may abut the movable core 21 onto the back surface 3a of the vibration member 3, as illustrated in FIG. 3.

In a state where the coil 22 is deenergized, the retracting movement of the movable core 21 with respect to the vibration member 3 may by accelerated by a return assistance mechanism 41 (e.g., elastic retracting member 51).

The tactile generation method may generate vibration (tactile generation) on (e.g., near touch switches 65 of) an interior part 2 installed on a vehicle 61 with the vibration member 3.

Operation

Hereinafter, the operation of this embodiment will be described.

The tactile generation apparatus 1 includes the vibration member 3 and the vibration generator 4 and generates vibration on the vibration member 3 by means of the vibration generator 4 installed on the back surface 3a of the vibration member 3 when the front surface 3b of the vibration member 3 is touched. Accordingly, the tactile generation apparatus 1 provides the vibration of the vibration member 3 as tactile sensation or emphasizes the tactile sensation. As a result, it is possible to artificially give an actual feeling (operation feeling as if you actually operated something) to a user touched the front surface 3b of the vibration member 3.

Preferably, an elastically deformable member is used as the vibration member 3. With this, the vibration of the vibration member 3 generated by the vibration generator 4 becomes large so as to facilitate the user to feel the tactile sensation.

The tactile generation apparatus 1 may be associated with, for example, an input device such as the touch switch 65. With this, the user can feel tactile sensation (operation feeling) in response to an input to the touch switch 65. For example, if the tactile generation apparatus 1 is provided with a plurality of the touch switches 65, the tactile generation apparatus 1 generates vibration on the vibration member 3 by means of the vibration generator 4 installed on the back surface 3a of the vibration member 3 in response to a touch on any one of the touch switches 65. With this, it is possible to generate tactile sensation. In this case, the press deformation amounts α, β of the vibration generator 4 with respect to the vibration member 3 may be changed in accordance with the distances L1, L2 from the touch switches 65. Additionally, the tactile generation apparatus 1 may be used independently, for example, in order to attract attention by means of the vibration.

Effects

In accordance with the embodiment, it is possible to achieve the following technical effects.

(Effect 1) The vibration generator 4 is configured with the solenoid 23 including the movable core 21. When the coil 22 is energized, the solenoid 23 causes the movable core 21 to move or protrude toward the vibration member 3 by an electromagnetic force so as to forcibly press and deform the vibration member 3 from the back surface 3a toward the front surface 3b. When the coil 22 is deenergized, the electromagnetic force is released from the solenoid 23 and the movable core 21 moves away or pulled from the vibration member 3 so as to release the deformation of the vibration member 3 instantly. By releasing the pressing force applied by the movable core 21 instantly, the vibration member 3 tries to restore its shape rapidly due to the self-elastic force. With this, the vibration occurs on the vibration member 3, and pseudo tactile sensation is generated due to the vibration of the vibration member 3.

Prior to generating vibration, the movable core 21 is set in the standby state in which the movable core 21 abuts onto the back surface 3a of the vibration member 3 by the abutting mechanism 24. By setting in the standby state, it is possible to generate vibration on the vibration member 3 without directly hitting the vibration member 3. That is, the solenoid 23 performs the operation without directly hitting the back surface 3a of the vibration member 3 by the movable core 21, thereby eliminating loud hitting sound. Additionally, the vibration of the vibration member 3 is generated due to the elastic restoring force of the vibration member 3. Therefore, it is possible to achieve more natural vibration and tactile sensation as compared with the case where the vibration is generated by forcibly hitting the vibration member 3.

As described above, in order to generate vibration on the vibration member 3 by utilizing the deformation and the shape restoration due to the elastic force of the vibration member 3 without directly hitting the vibration member 3, it is advantageous to use a relatively large vibration generator 4 such as the solenoid 23.

In order to install the vibration generator 4 on the back surface 3a of the vibration member 3, it is necessary to consider the influence of dimensional variations (of the vibration member 3 and/or the vibration generator 4). However, since the solenoid 23 is a relatively large vibration generator 4 and the movable core 21 has a relatively large movable stroke, the solenoid 23 is less susceptible to such dimensional variations as compared with other small vibration generators with small vibration amplitude. Thus, it is easy to install the vibration generator 4. Further, it is not necessary to provide an additional means for absorbing such dimensional variations to install the vibration generator 4 on the back surface 3a of the vibration member 3. Consequently, it is structurally advantageous to use the solenoid 23 as it is possible to reduce the influence of dimensional variations and to achieve stable operations.

Additionally, the influence of the dimensional variations when installing the vibration generator 4 on the back surface 3a of the vibration member 3 is easily absorbed by setting the movable core 21 to abut onto the back surface 3a of the vibration member 3 by means of the abutting mechanism 24 in the standby state.

(Effect 2) The abutting mechanism 24 may be the elastic abutting member 31. By utilizing the elastic force of the elastic abutting member 31, it is possible to position the tip of the movable core 21 to lightly abut onto the back surface 3a of the vibration member 3 in the standby state easily and reliably while protruding the tip of the movable core 21 to the intermediate position in the movable range. Additionally, it is advantageous that the elastic abutting member 31 hardly disturbs the vibration of the vibration member 3 when the solenoid 23 generates vibration on the vibration member 3.

Here, the elastic abutting member 31 such as a spring or an elastic body may be used as the abutting mechanism 24. With this, it is possible to simplify the configuration of the abutting mechanism 24 as compared with the case where the abutting mechanism 24 uses another actuator to be driven electrically.

If the movable core 21 is retracted due to de-energization in the middle of the operating state in which the vibration is being generated, the movable core 21 may be temporarily separated from the back surface 3a of the vibration member 3 and again abut onto the back surface 3a of the vibration member 3. However, the distance that the movable core 21 is separated from the vibration member 3 due to such phenomenon is small. Further, when the movable core 21 abuts onto the back surface 3a of the vibration member 3 after the separation, the movable core 21 abuts thereto due to the elastic force of the elastic abutting member 31, not due to (the electromagnetic force of) the vibration generator 4. Therefore, it prevents the movable core 21 from hardly hitting the back surface 3a of the vibration member 3, thereby decreasing and suppressing the hitting sound to a level that is not particularly disturbing.

(Effect 3) The return assistance mechanism 41 may be provided in order to accelerate the retracting movement of the movable core 21 with respect to the vibration member 3 when the coil 22 is deenergized in the middle of the operating state for generating vibration. That is, the return assistance mechanism 41 assists the movable core 21 to move away from the vibration member 3 when the electromagnetic force is released by deenergizing the coil 22. Accordingly, it is therefore possible to faster the timing of generating vibration on the vibration member 3 (i.e., response of the vibration member 3).

(Effect 4) The return assistance mechanism 41 may be the elastic retracting member 51. The elastic retracting member 51 is deformed along with the movement of the movable core 21 so as to accumulate the elastic force when the movable core 21 is protruded to the maximum protruding position due to the electromagnetic force of the solenoid 23. Here, the elastic retracting member 51 may be made of an elastic member having an elastic force weaker than that of the elastic abutting member 31 (i.e., elastic force of elastic retracting member 51<elastic force of elastic abutting member 31), such that the elastic retracting member 51 is slightly deformed by the elastic force of the elastic abutting member 31 in the standby state in which the movable core 21 is protruded to the intermediate position.

The return assistance mechanism 41 may include the elastic retracting member 51 such as a spring or an elastic body. With this, it is possible to simplify the configuration of the return assistance mechanism 41 as compared with the case where the return assistance mechanism 41 includes another actuator to be driven electrically.

To be specific, the elastic retracting member 51 (return assistance mechanism 41) hardly accumulates the elastic force or slightly accumulates the elastic force as slightly being deformed by the elastic abutting member 31 when the movable core 21 lightly abuts onto the back surface 3a of the vibration member 3 by the elastic abutting member 31 in the standby state. At this state, most of the accumulated elastic force is consumed as the elastic abutting member 31 (abutting mechanism 24) abuts the movable core 21 onto the vibration member 3.

When the movable core 21 is forcibly protruded by energizing the coil 22, the elastic retracting member 51 is deformed and the elastic force is maximally accumulated. At this state, the elastic abutting member 31 (abutting mechanism 24) protrudes the movable core 21 to the maximum protruding position so as to be stretched to or near its natural length, thereby almost no accumulated elastic force remains (or the elastic abutting member 31 may be stretched more than its natural length so as to accumulate the elastic force in the opposite direction).

Upon deenergizing the coil 22, the vibration member 3 returns to the original shape and the elastic force accumulated in the elastic retracting member 51 is rapidly released such that the movable core 21 is pressed to move away from the vibration member 3. Accordingly, the response of the vibration member 3 increases by the elastic force added by the elastic retracting member 51 as compared with the response of the vibration member 3 achieved by the restoring force of the vibration member 3 itself and the weight of the movable core 21. That is, the response of the vibration member 3 is accelerated by the difference between the elastic force of the elastic retracting member 51 at the time of deenergizing and the elastic force of the elastic abutting member 31 (i.e., response speed without elastic retracting member 51<response speed with elastic retracting member 51). At the same time, the elastic abutting member 31 (abutting mechanism 24) accumulates an elastic force to abut the movable core 21 onto the back surface 3a of the vibration member 3 again.

The movable core 21 then returns to the standby state (in which the movable core 21 lightly abuts onto the back surface 3a of the vibration member 3) due to the elastic force accumulated in the elastic abutting member 31.

(Effect 5) The vibration member 3 may be provided at the interior part 2 installed on the vehicle 61. With this, the interior part 2 in the vehicle 61 integrally achieves the tactile generation function, thereby easily obtaining the interior part 2 having the tactile generation function.

The tactile generation apparatus 1 may be, for example, solely provided to the interior part 2 such as a steering wheel and a seat. With this, it is possible to quickly transmit warning information (e.g., warning information for pedestrian jumping out, sudden interruption of a preceding vehicle, sudden stop of a preceding vehicle) detected by the vehicle 61 during the travel through the interior part 2 so as to attract attention of the occupant(s). Such warning information may be, for example, acquired through information processing of signals from various sensors and/or cameras installed in the vehicle for autonomous driving.

(Effect 6) The vibration generator 4 may be provided around the touch switch 65, which is installed on the interior part 2. With this, it is possible to generate tactile sensation in response to an input to the touch switch 65. Additionally, if the tactile generation apparatus 1 is provided on the back surface 3a of the vibration member 3 together with the touch switch 65, the interior part 2 achieves an advanced switch panel. That is, the interior part 2 is equipped with the switch invisible from the outside (as the touch switch 65 is provided on the back surface 3a), and this invisible switch provides tactile sensation (by the tactile generation apparatus, the tactile sensation being similar to a switch button physically pressed by a finger).

(Effect 7) In the tactile generation method using the tactile generation apparatus 1, prior to generating vibration, the movable core 21 is made to standby while abutting onto the back surface 3a of the vibration member 3 by means of the abutting mechanism 24. The movable core 21 is then pressed to the vibration member 3 to press and deform the vibration member 3. After that, the movable core 21 is moved away from the vibration member 3 to allow the vibration member 3 to return its original shape so as to generate vibration on the vibration member 3. With this tactile generation method, it is possible to achieve the similar effects to the abovementioned Effect 1.

This embodiment additionally includes the following features.

(Effect 8) The plurality of touch switches 65, at which the vibration generator(s) 4 generate vibration, may be arranged on the back surface 3a of the vibration member 3. The vibration generator 4 in this embodiment is configured not to hit the vibration member 3 directly, but configured to generate vibration on the vibration member 3 with its elastic restoring force by means of the solenoid 23, thereby the vibration is easily transmitted to a wide range of the vibration member 3. With this, it is possible for the single vibration generator 4 to generate vibration (i.e., tactile sensation created by haptic vibration) in response to manipulations on the plurality of touch switches 65 simultaneously. Therefore, it is possible to reduce the number of the vibration generators 4 so as to reduce the installation space and the cost of the vibration generators 4. Further, the vibration generator 4 may be configured such that the press deformation amounts $\alpha$, $\beta$ with respect to the vibration member 3 differ depending on the touch switches 65 ($\alpha<\beta$). With this, it is possible to individually change the vibration magnitude of the vibration member 3 for each touch switch 65. Therefore, it is possible to arbitrarily determine and adjust the vibration magnitude in accordance with the manipulation of each touch switch 65. Alternatively, the vibration can be associated with which touch switch 65 is touched, depending on the vibration magnitude applied to the vibration member 3.

(Effect 9) The vibration generator 4 may be configured such that the press deformation amounts $\alpha$, $\beta$ with respect to the vibration member 3 differ in accordance with the distances L1, L2 from the touch switches 65. With this, it is possible to differently determine the press deformation amounts $\alpha$, $\beta$ with respect to the vibration member 3 based on the distances L1, L2 from the touch switches 65. Accordingly, it is possible to simplify the determination of the press deformation amounts α, β with respect to the vibration member 3.

(Effect 10) The vibration generator 4 may be configured such that the press deformation amounts α, β with respect to the vibration member 3 are reduced as the distances L1, L2 (L1<L2) from the touch switches 65 decrease (i.e., the press deformation amount α is set for the distance L1, and the press deformation amount β is set for the distance L2). Alternatively, the press deformation amounts α, β with respect to the vibration member 3 may increase as the distances L1, L2 from the touch switches 65 increase. With this, irrespective of the distances L1, L2 from the vibration generator 4, it is possible, for example, to make the vibration of the vibration member 3 feel constant regardless of which touch switch 65 is touched. With this, it is possible to achieve stable tactile sensation.

(Effect 11) The vibration generation method achieves tactile sensation by generating vibration on the vibration member 3 by means of the vibration generator 4 installed on the back surface of the vibration member 3 when one of the plurality of touch switches 65 installed on the back surface of the vibration member 3 is touched. The vibration generator 4 is a solenoid 23 including the movable core 21, which is capable of moving close to and away from the vibration member 3, and the coil 22, which presses the movable core 21 to the vibration member 3 when energized. The movable core 21 is pressed to the vibration member 3 to deform the vibration member 3 upon energization, and the movable core 21 is moved away from the vibration member 3 to allow the vibration member 3 to return its original shape upon de-energization. As a result, vibration is generated on the vibration member 3 due to its own elastic restoring force. Additionally, the vibration generator 4 may be configured such that the press deformation amounts α, β with respect to the vibration member 3 differ depending on the touch switches 65. With the method described above, it is possible to achieve the similar effect to the abovementioned Effect 8.

The tactile generation method may change the press deformation amounts α, β with respect to the vibration member 3 in accordance with the distances L1, L2 from the touch switches 65. With this, it is possible to achieve the similar effect to the abovementioned Effect 9.

The tactile generation method may reduce the press deformation amounts α, β with respect to the vibration member 3 as the distances L1, L2 (L1<L2) from the touch switches 65 decrease (i.e., the press deformation amount α is set for the distance L1, and the press deformation amount β is set for the distance L2). With this, it is possible to achieve the similar effect to the abovementioned Effect 10.

The invention claimed is:

1. A tactile generation apparatus, comprising:
a vibration member; and
a vibration generator that is installed on a back surface of the vibration member, wherein
the vibration generator is configured with a solenoid comprising a movable core and a coil, the movable core being capable of moving close to and away from the vibration member, and
the coil is configured to displace the movable core to the vibration member so as to press and deform the vibration member when energized, while the coil is configured to move the movable core away from the vibration member when deenergized, so as to vibrate the vibration member due to an elastic restoring force of the vibration member.

2. The tactile generation apparatus according to claim 1, further comprising a plurality of touch switches provided on the back surface of the vibration member, wherein
the plurality of touch switches are configured to generate vibration on the vibration member by means of the vibration generator, and
the vibration generator is configured to change press deformation amounts with respect to the vibration member in accordance with distances from the plurality of touch switches.

3. The tactile generation apparatus according to claim 2, wherein the vibration generator is configured to reduce the press deformation amounts with respect to the vibration member as the distances from the plurality of touch switches decrease.

4. The tactile generation apparatus according to claim 1, further comprising an abutting mechanism configured to put the movable core in a standby state in which the movable core abuts onto the back surface of the vibration member when the coil is deenergized.

5. The tactile generation apparatus according to claim 4, wherein the abutting mechanism is an elastic abutting member configured to press the movable core to the back surface of the vibration member.

6. The tactile generation apparatus according to claim 1, further comprising a return assistance mechanism configured to accelerate a retracting movement of the movable core with respect to the vibration member when the coil is deenergized.

7. The tactile generation apparatus according to claim 6, wherein the return assistance mechanism is an elastic retracting member configured to press the movable core in a direction away from the vibration member.

8. The tactile generation apparatus according to claim 1, wherein the vibration member is provided to an interior part of a vehicle.

9. The tactile generation apparatus according to claim 1, wherein the vibration generator is provided around a touch switch installed on an interior part of a vehicle.

10. A tactile generation method of generating vibration on a vibration member by means of a vibration generator installed on a back surface of the vibration member to achieve tactile sensation, the vibration generator being a solenoid comprising a movable core, which is capable of moving close to and away from the vibration member, and a coil, which presses the movable core to the vibration member when energized,
the method comprising:
pressing the movable core to the vibration member to press and deform the vibration member when energized; and
moving the movable core away from the vibration member to allow the vibration member to return its original shape when deenergized, so as to generate vibration on the vibration member due to an elastic restoring force of the vibration member.

11. The tactile generation method according to claim 10, wherein
the method generates vibration on the vibration member by means of the vibration generator when one of plurality of touch switches installed on the back surface of the vibration member is touched, and
the vibration generator is configured to change press deformation amounts with respect to the vibration member in accordance with distances from the plurality of touch switches.

12. The tactile generation method according to claim 10, wherein the method uses an abutting mechanism to put the movable core in a standby state in which the movable core abuts onto the back surface of the vibration member when the coil is deenergized.

\* \* \* \* \*